United States Patent
Lee

(10) Patent No.: US 8,203,635 B2
(45) Date of Patent: Jun. 19, 2012

(54) IMAGE SENSOR WITH A SPECTRUM SENSOR

(75) Inventor: Byoung-Su Lee, Yeosu-si (KR)

(73) Assignee: Siliconfile Technologies Inc., Seoul (KR)

( * ) Notice: Subject to any disclaimer, the term of this patent is extended or adjusted under 35 U.S.C. 154(b) by 56 days.

(21) Appl. No.: 12/745,807

(22) PCT Filed: Dec. 3, 2008

(86) PCT No.: PCT/KR2008/007117
§ 371 (c)(1),
(2), (4) Date: Jun. 2, 2010

(87) PCT Pub. No.: WO2009/075487
PCT Pub. Date: Jun. 18, 2009

(65) Prior Publication Data
US 2010/0271516 A1    Oct. 28, 2010

(30) Foreign Application Priority Data
Dec. 11, 2007  (KR) .......... 10-2007-0127919

(51) Int. Cl.
*H04N 3/14* (2006.01)
*H04N 5/335* (2011.01)

(52) U.S. Cl. ..................... 348/294

(58) Field of Classification Search ........... 348/89–94, 348/125–130, 163, 266–283, 131, 135–142, 348/294
See application file for complete search history.

(56) References Cited

U.S. PATENT DOCUMENTS

| 4,902,137 | A  | * | 2/1990 | Krieg et al. ............ 356/427 |
| 5,438,417 | A  | * | 8/1995 | Busch et al. ............ 356/394 |
| 5,510,620 | A  | * | 4/1996 | Achter et al. .......... 250/339.12 |
| 5,791,345 | A  | * | 8/1998 | Ishihara et al. ........... 600/368 |
| 6,026,314 | A  | * | 2/2000 | Amerov et al. ........... 600/322 |
| 6,221,521 | B1 | * | 4/2001 | Lynn et al. .............. 428/703 |
| 6,384,458 | B1 |   | 5/2002 | Bode et al. |
| 6,388,754 | B1 | * | 5/2002 | Nishikawa et al. ....... 356/601 |
| 7,570,286 | B2 | * | 8/2009 | Koike et al. ............. 348/235 |
| 7,728,873 | B2 | * | 6/2010 | Segman ............... 348/207.99 |
| 7,756,365 | B2 | * | 7/2010 | Cunningham et al. ....... 385/12 |

(Continued)

FOREIGN PATENT DOCUMENTS

KR    10-2005-0117266 A    12/2005

(Continued)

OTHER PUBLICATIONS

International Search Report mailed on Jul. 29, 2009 in International Application No. PCT/KR2008/007117.

(Continued)

*Primary Examiner* — Nhan T Tran
*Assistant Examiner* — Tuan Le
(74) *Attorney, Agent, or Firm* — Kile Park Goekjian Reed & McManus PLLC

(57) ABSTRACT

There is provided an image sensor with a spectrum sensor including an image sensor region having a plurality of light-detection parts and a spectrum sensor region located in the image sensor region. The present invention provides an advantage of manufacturing a low-cost image sensor with a spectrum sensor. Thus, the image sensor with a spectrum sensor is commercially available to measure the structure and quantity of an organic material in an object in a simple manner.

8 Claims, 3 Drawing Sheets

U.S. PATENT DOCUMENTS

| | | | |
|---|---|---|---|
| 2003/0132386 A1 | 7/2003 | Carr et al. | |
| 2003/0185707 A1* | 10/2003 | Iwaki et al. | 422/58 |
| 2003/0210332 A1* | 11/2003 | Frame | 348/216.1 |
| 2007/0285540 A1* | 12/2007 | Kwon et al. | 348/272 |
| 2008/0087800 A1* | 4/2008 | Toda | 250/214 C |
| 2008/0093540 A1* | 4/2008 | Horimoto et al. | 250/227.11 |
| 2010/0220322 A1* | 9/2010 | Fujimura et al. | 356/246 |

FOREIGN PATENT DOCUMENTS

KR     10-0733496 B1     6/2007

OTHER PUBLICATIONS

Written Opinion of the International Searching Authority mailed on Jul. 29, 2009 in International Application No. PCT/KR2008/007117.

* cited by examiner

【Figure 1】
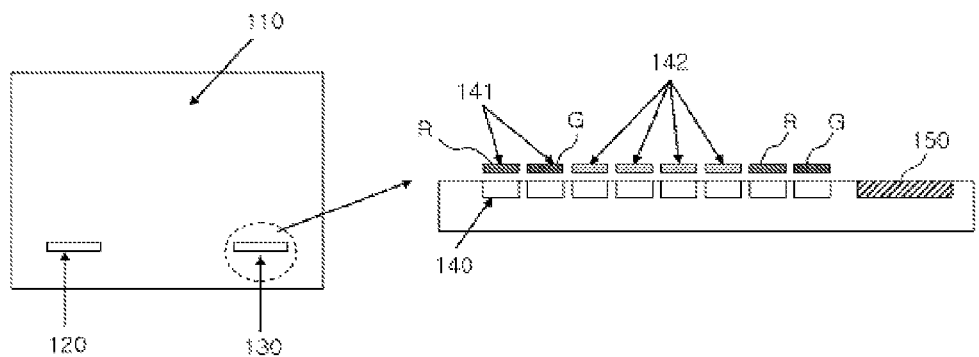
【Figure 2】
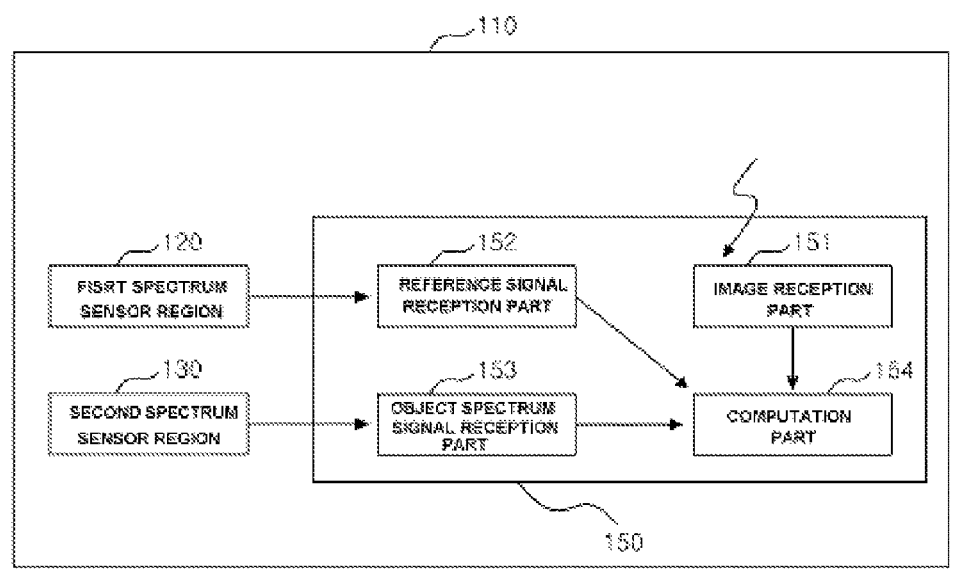

【Figure 3】
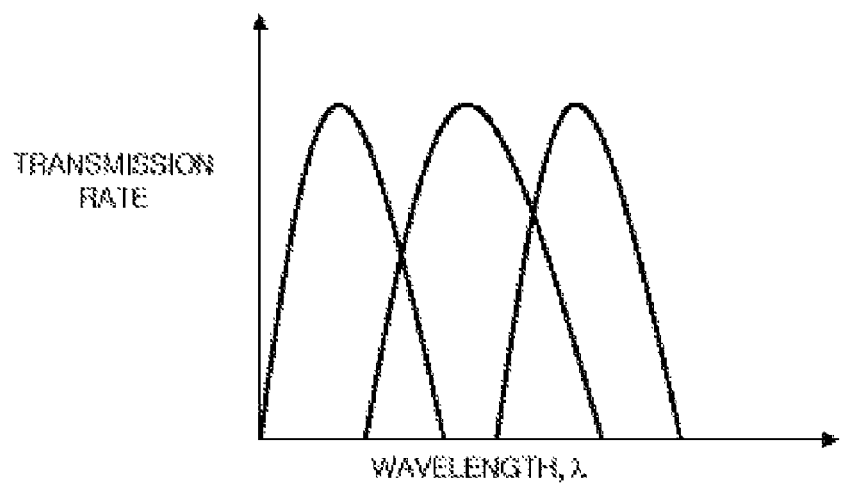
【Figure 4】
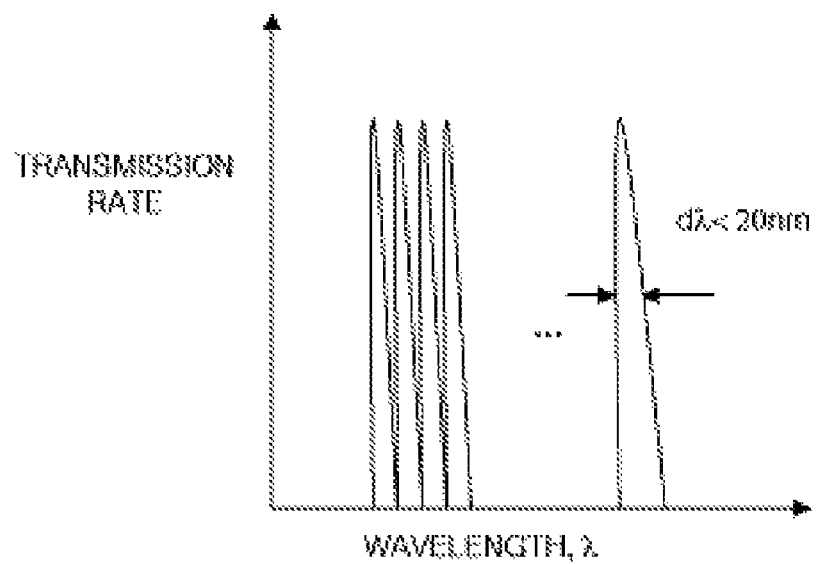

【Figure 5】
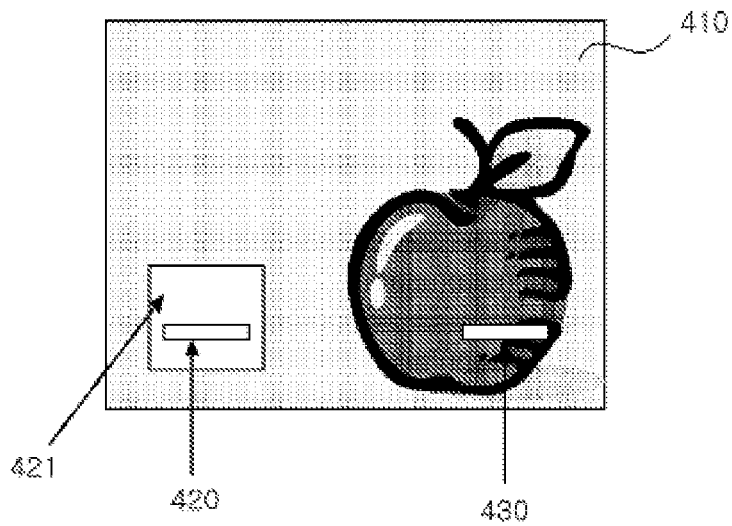
【Figure 6】
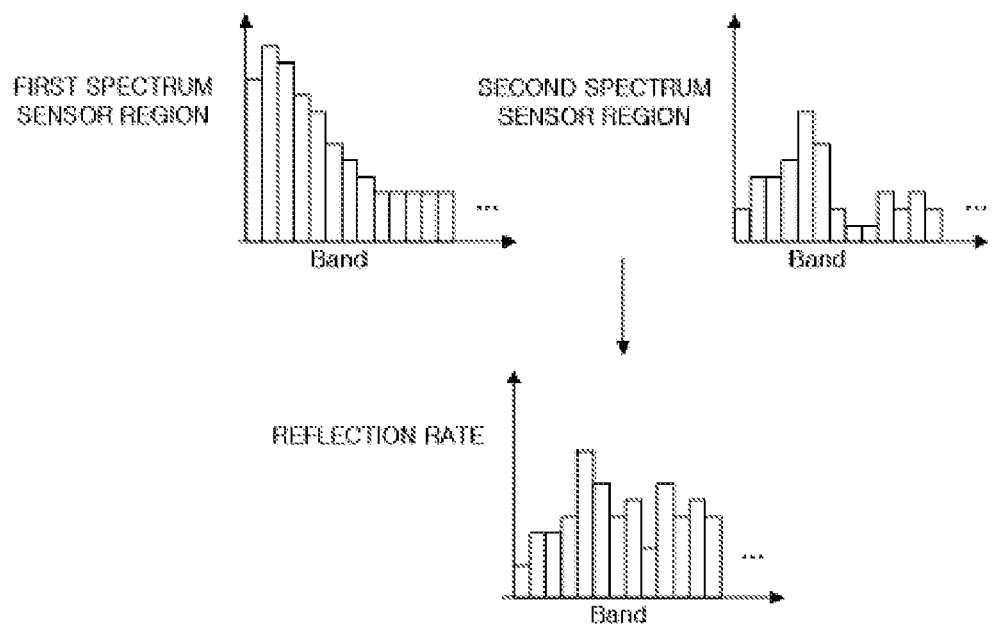

IMAGE SENSOR WITH A SPECTRUM SENSOR

TECHNICAL FIELD

The present invention relates to an image sensor with a spectrum sensor, and more particularly, to an image sensor with a spectrum sensor, in which a spectrum sensor region is located in an image sensor region.

BACKGROUND ART

An image sensor, when combined with other components such as a lens, recognizes the color and shape of an object. Generally, the image sensor recognizes the color of the object, using the three color filters: red, green, and blue ones.

Spectrochemistry is the application of spectroscopy. In the field of spectrochemistry, the structure and quantity of a specific chemical can be identified by measuring a transmission or reflection rate that it has with respect to an incident beam. Infrared region of spectrum is used to derive the structure of an agricultural chemical or an organic material and to qualitatively and quantitatively analyze its presence in the object.

The spectrum sensor for use in spectrochemistry, which is in wide use at a laboratory includes a high-precision spectroscope and high-sensitivity sensors. However, this spectrum sensor is not suitable in everyday life for detection of a residual of the agricultural chemical remaining in a food or for measurement of an organic material.

DISCLOSURE

Technical Problem

An object of the present invention is to provide an image sensor with a spectrum sensor, in which a spectrum sensor region is located in an image sensor region, and which is conveniently used in everyday life, instead of expensive spectrograph equipment, to measure the structure and quantity of an organic material in an object. Disclosure of the Invention

Technical Solution

According to an aspect of the present invention, there is provided an image sensor with a spectrum sensor, including an image sensor region having a plurality of light-detection parts and a spectrum sensor region located in the image sensor region.

The spectrum sensor region may include a first spectrum sensor region for obtaining a reference signal and a second spectrum sensor region for obtaining a spectrum signal of an object.

The image sensor with a spectrum sensor may further include an image signal processor for analysing and processing an image obtained in the image sensor region and a spectrum signal obtained in the spectrum sensor region.

Advantageous Effects

The image sensor with a spectrum sensor according to the present invention has a spectrum sensor region with a narrow-width band pass filter in an image sensor region, which is formed using a semiconductor process. This makes it possible to manufacture a low-cost image sensor with a spectrum sensor. Thus, the image sensor with a spectrum sensor is commercially available to measure the structure and quantity of an organic material in an object in a simple manner.

Existence of the spectrum sensor region in the image sensor region makes it possible to correctly designate the object. Thus, the structure and quantity of a residual of an organic material in an object, such as a food and a sample, can be measured while taking a photograph of the object.

DESCRIPTION OF DRAWINGS

FIG. 1 is a schematic view of a construction of an image sensor with a spectrum sensor according to the present invention.

FIG. 2 is a schematic view of a construction of the image signal processor provided in the image sensor with the spectrum sensor according to the present invention.

FIG. 3 is a view of a transmission rate of a color filter for the visible light image.

FIG. 4 is a view of a transmission rate of the band pass filter for the spectrum sensor region.

FIG. 5 is a view that helps describe a method of analyzing an organic material using the image sensor with the spectrum sensor according to the present invention.

FIG. 6 is a view illustrating a step of obtaining a reflection rate by comparing a spectrum signal of the object with a reference signal.

BEST MODE

Hereinafter, exemplary embodiments of the present invention will be described in detail with reference to the accompanying drawings.

FIG. 1 is a schematic view of a construction of an image sensor with a spectrum sensor according to the present invention.

Referring to FIG. 1, the image sensor with a spectrum sensor includes an image sensor region and a spectrum sensor region located in the image sensor region.

The image sensor region 110 includes a plurality of light-detection part 140. The light detection part 140 is at least one selected from a group including a photodiode, a photo transistor, and a photo conductor. A color filter 141 for a visible light image is provided on each of light-detection parts 140 to obtain an image of the object.

The spectrum sensor region is located in the image sensor region 110. The spectrum sensor region includes a first spectrum sensor region 120 for obtaining a reference signal and a second spectrum sensor region 130 for obtaining a spectrum signal of the object. The spectrum sensor region has band pass filters 142 for the spectrum sensor on each of the light-detection parts 140.

The image sensor with the spectrum sensor according to the present invention further includes an image signal processor (ISP) analyzing and processing the image and the spectrum signal which are obtained.

The image signal processor 150 analyses and processes the image obtained in the image sensor region 110 and a spectrum signal obtained in the spectrum sensor regions 120 and 130, in a statistical manner, using a built-in program. This gives the measured structure and quantity a high degree of reliability.

FIG. 2 is a schematic view of a construction of the image signal processor provided in the image sensor with the spectrum sensor according to the present invention.

Referring to FIG. 2, the image signal processor 150 includes an image reception part 151 receiving the image obtained in the image sensor region 110, a reference signal reception part 152 receiving a reference signal for checking a current lighting condition from the first spectrum sensor region 120, a object spectrum signal reception part 153 receiving from the second spectrum sensor region 130 a spectrum signal of the object that passed the band pass filter, and a computation part 154 computing a reflection or transmission rate of the object with respect to each band of the band pass filter by comparing the spectrum signal of the object with the reference signal.

FIG. 3 is a view of a transmission rate of a color filter for the visible light image. FIG. 4 is a view of a transmission rate of the band pass filter for the spectrum sensor region.

The spectrum sensor region includes the light-detection parts, each having several band pass filters with a narrow band width. The transmission rate of the band pass filter located on each of the light-detection part, as a example, is shown in FIG. 4.

Generally, a silicon light detection device is light-sensitive in the range of 350 nm to 1100 nm. If the bandwidth is too narrow, a lot of the band pass filters are needed and an amount of incident light decreases. This requires an corresponding increase in sensitivity degree of the sensor. If the band is too broad, it is difficult to distinguish an at-the-peak spectrum of the object with the band width of 20 nm or so. To prevent this, the band pass filter may have a band width of 20 nm or less, taking the number and sensitivity of the band pass filter into consideration.

A plurality of the band pass filters, each having a band width of 20 nm or less, are employed with the band widths overlapping with each other, to measure the spectrum signal of the object. This is, the band pass filters with bandwidths of 700 nm~720 nm, 710 nm~730 nm, and 720 nm~740 nm may be employed.

FIG. 5 is a view that helps describe a method of analyzing an organic material using the image sensor with the spectrum sensor according to the present invention. FIG. 6 is a view illustrating a step of obtaining a reflection rate by comparing a spectrum signal of the object with a reference signal.

As shown in FIG. 5, the image sensor with the spectrum sensor according to the present invention, positions the object such as a food on a second spectrum sensor region 430, and positions a reference object 421 for checking a lighting condition on a first spectrum sensor region 420. The reference object 421, like a white reflection plate, is defined as a diffuser having the same reflection rate with respect to all wavelengths of a source of light.

In the image sensor region 410, an image of the object is obtained through a color filter for a visible light image. In the second spectrum sensor region 430, a second spectrum signal to pass the band pass filter of the second spectrum sensor region 430 is obtained. In the first spectrum sensor region 420, a first spectrum signal is obtained which is used to be compared with the spectrum signal of the object that passed the band pass filter of the first spectrum sensor region.

As shown in FIG. 6, a reflection rate that the object, such as the food, has with respect to each band is obtained by obtaining a ratio of the first spectrum signal (the reference signal) to the second spectrum signal (the spectrum signal of the object). That is, the reflection rate of the object with respect to each band is the ratio of the first spectrum signal (the reference signal) to the second spectrum signal (the spectrum signal of the object).

Most of the organic material have a particular absorption band or a particular reflection band, in the infrared range. Therefore, a component of the organic material is identified by finding the band that the object strongly reflects. This makes it possible to determine if a residual of an agricultural chemical or an organic material remains in the object, or if any, how much it remains in the object, based on the reflection spectrum of it with respect to each band. In this regard, the reflection rate or the absorption rate is linearly proportional to an amount of the residual of the object or the organic material.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

The invention claimed is:

1. An image sensor with a spectrum sensor, comprising:
an image sensor region having a plurality of light-detection parts;
a spectrum sensor region located in the image sensor region; and
an image signal processor analyzing and processing an image which is obtained by the image sensor region and a spectrum signal which is obtained by the spectrum sensor region, the image signal processor being configured to compute a reflection or transmission rate of an object with respect to a band of a band pass filter,
wherein the spectrum sensor region comprises:
a first spectrum sensor region for obtaining a reference signal for checking a current lighting condition; and
a second spectrum sensor region for obtaining a spectrum signal of the object that passed the band pass filter on a light-detection part for the spectrum sensor region.

2. The image sensor with the spectrum sensor according to claim 1, wherein the image signal processor comprises:
an image reception part receiving the image obtained in the image sensor region;
a reference signal reception part receiving the reference signal from the first spectrum sensor region;
an object spectrum signal reception part receiving from the second spectrum sensor region the spectrum signal of the object; and
a computation part computing the reflection or transmission rate of the object by comparing the spectrum signal of the object with the reference signal.

3. The image sensor with the spectrum sensor according to claim 1, wherein the plurality of light-detection parts comprises:
a light-detection part for the image sensor region; and
a light-detection part for the spectrum sensor region.

4. The image sensor with the spectrum sensor according to claim 3,
wherein the image sensor region further comprises a color filter provided on each of the light-detection parts for the image sensor region.

5. The image sensor with the spectrum sensor according to claim 3,
wherein the spectrum sensor region further comprises a band pass filter provided on each of the light-detection parts for the spectrum sensor region.

6. The image sensor with the spectrum sensor according to claim 5, wherein a band width of light wavelength transmitting the band pass filter is 20 nm or less.

7. The image sensor with the spectrum sensor according to claim 6, wherein band widths of a plurality of band pass filters overlap with each other.

8. The image sensor with the spectrum sensor according to claim 1, wherein each light-detection part is at least one selected from a group including a photodiode, a photo transistor and a photo conductor.

* * * * *